United States Patent
Moon et al.

(10) Patent No.: US 8,843,225 B2
(45) Date of Patent: *Sep. 23, 2014

(54) PORTABLE SOUND REPRODUCING SYSTEM AND METHOD

(75) Inventors: Kwang-su Moon, Seoul (KR); Jung-ha Hwang, Seoul (KR)

(73) Assignee: Mpman.com, Inc., Seoul (KR)

( * ) Notice: Subject to any disclaimer, the term of this patent is extended or adjusted under 35 U.S.C. 154(b) by 376 days.

This patent is subject to a terminal disclaimer.

(21) Appl. No.: 13/253,898

(22) Filed: Oct. 5, 2011

(65) Prior Publication Data

US 2012/0029673 A1      Feb. 2, 2012

Related U.S. Application Data

(60) Continuation of application No. 11/586,462, filed on Oct. 25, 2006, now Pat. No. 8,116,890, which is a continuation of application No. 11/411,546, filed on Apr. 26, 2006, now Pat. No. 8,170,700, which is a continuation of application No. 10/059,777, filed on Jan. 29, 2002, now Pat. No. 7,065,417, which is a division of application No. 09/061,647, filed on Apr. 17, 1998, now Pat. No. 6,629,000.

(51) Int. Cl.
| | |
|---|---|
| *G06F 17/00* | (2006.01) |
| *H03G 3/00* | (2006.01) |
| *G06T 9/00* | (2006.01) |
| *G11C 7/16* | (2006.01) |
| *G11C 7/10* | (2006.01) |
| *G11C 5/14* | (2006.01) |
| *G11B 27/10* | (2006.01) |
| *G11B 20/00* | (2006.01) |
| *G11B 20/10* | (2006.01) |

(52) U.S. Cl.
CPC ........ *G11C 7/16* (2013.01); *G11B 2020/00057* (2013.01); *G06T 9/007* (2013.01); *G11B 2020/00014* (2013.01); *G11C 2207/16* (2013.01); *G11C 7/1006* (2013.01); *G11C 5/141* (2013.01); *G11B 2220/61* (2013.01); *G11B 27/105* (2013.01); *G11B 2020/10546* (2013.01); *G11B 20/10* (2013.01)
USPC .................. 700/94; 381/61; 704/272; 369/63

(58) Field of Classification Search
USPC ........ 700/94; 381/61; 369/63, 31.01; 360/32, 360/55; 84/270, 272, 278, 500, 601–604
See application file for complete search history.

(56) References Cited

U.S. PATENT DOCUMENTS

| | | |
|---|---|---|
| 4,097,905 A | 6/1978 | Kramer |
| 4,156,286 A | 5/1979 | Connors et al. |

(Continued)

FOREIGN PATENT DOCUMENTS

| | | |
|---|---|---|
| AU | B-61907/96 | 2/1997 |
| DE | 41 35 220 C1 | 4/1993 |

(Continued)

OTHER PUBLICATIONS

Xing Sound Player software application (screenshots)—Release Date: believed to be Feb. 15, 1995 (8 pgs).

(Continued)

*Primary Examiner* — Xu Mei
(74) *Attorney, Agent, or Firm* — Lee, Hong, Degerman, Kang & Waimey

(57) ABSTRACT

A portable audio device suitable for reproducing MPEG encoded data includes a plurality of inputs, a data storage, a display, an audio output, at least one processor, and a battery. The plurality of inputs includes a forward input, a play control input, and a random input. The data storage stores compressed digitized audio data. The at least one processor is responsive to selection of at least one of the plurality of inputs to convert selected compressed digitized audio data stored in the data storage for reproduction by the audio output and to provide information to the display.

32 Claims, 6 Drawing Sheets

(56) References Cited

U.S. PATENT DOCUMENTS

| | | | |
|---|---|---|---|
| 4,205,354 A | 5/1980 | Kramer | |
| 4,667,088 A | 5/1987 | Kramer et al. | |
| 4,790,003 A | 12/1988 | Kepley et al. | |
| 4,800,520 A | 1/1989 | Iijima | |
| 4,900,902 A | 2/1990 | Sakakibara | |
| 5,014,318 A | 5/1991 | Schott et al. | |
| 5,132,992 A | 7/1992 | Yurt et al. | |
| 5,247,347 A | 9/1993 | Litteral et al. | |
| 5,253,275 A | 10/1993 | Yurt et al. | |
| 5,400,687 A | 3/1995 | Ishii | |
| 5,408,448 A | 4/1995 | Carman | |
| 5,445,295 A | 8/1995 | Brown | |
| 5,481,645 A | 1/1996 | Bertino et al. | |
| 5,550,863 A | 8/1996 | Yurt et al. | |
| 5,568,650 A | 10/1996 | Mori | |
| 5,572,442 A | 11/1996 | Schulhof | |
| 5,619,570 A | 4/1997 | Tsutsui | |
| 5,636,276 A | 6/1997 | Brugger | |
| 5,675,693 A | 10/1997 | Kagoshima | |
| 5,682,434 A | 10/1997 | Boyden | |
| 5,687,143 A | 11/1997 | Takahashi et al. | |
| 5,689,732 A | 11/1997 | Kondo | |
| 5,703,795 A | 12/1997 | Mankovitz | |
| 5,724,482 A | 3/1998 | Grewe | |
| 5,726,909 A | 3/1998 | Krikorian | |
| 5,737,308 A | 4/1998 | Nakai et al. | |
| 5,739,451 A | 4/1998 | Winksy | |
| 5,740,143 A | 4/1998 | Suetomi | |
| 5,787,445 A | 7/1998 | Daberko | |
| 5,794,217 A | 8/1998 | Allen | |
| 5,798,921 A | 8/1998 | Johnson et al. | |
| 5,822,284 A | 10/1998 | Nishizawa | |
| 5,842,170 A | 11/1998 | Daberko et al. | |
| 5,901,119 A | 5/1999 | Inoue | |
| 5,914,706 A | 6/1999 | Kono | |
| 5,914,941 A | 6/1999 | Janky | |
| 5,959,945 A | 9/1999 | Kleiman | |
| 5,970,231 A | 10/1999 | Crandall | |
| 5,986,200 A | 11/1999 | Curtin | |
| 5,986,979 A | 11/1999 | Bickford et al. | |
| 6,023,290 A | 2/2000 | Seita | |
| 6,038,199 A | 3/2000 | Pawlowski et al. | |
| 6,067,279 A | 5/2000 | Fleming, III | |
| 6,105,142 A | 8/2000 | Goff | |
| 6,122,230 A | 9/2000 | Scibora | |
| 6,128,255 A | 10/2000 | Yankowski | |
| 6,134,631 A | 10/2000 | Jennings, III | |
| 6,148,243 A | 11/2000 | Ishii et al. | |
| 6,148,353 A | 11/2000 | Cho | |
| 6,169,847 B1 | 1/2001 | Mizoguchi et al. | |
| 6,198,941 B1 | 3/2001 | Aho et al. | |
| 6,199,076 B1 | 3/2001 | Logan et al. | |
| 6,226,449 B1 | 5/2001 | Inoue et al. | |
| 6,233,633 B1 | 5/2001 | Douma | |
| 6,271,455 B1 | 8/2001 | Ishigaki et al. | |
| 6,301,513 B1 | 10/2001 | Divon et al. | |
| 6,330,490 B1 | 12/2001 | Kim et al. | |
| 6,377,530 B1 | 4/2002 | Burrows | |
| 6,392,964 B2 | 5/2002 | Koyata et al. | |
| 6,397,189 B1 | 5/2002 | Martin et al. | |
| 6,445,800 B1 | 9/2002 | Nishiguchi et al. | |
| 6,549,942 B1 | 4/2003 | Janky et al. | |
| 6,587,404 B1 | 7/2003 | Keller et al. | |
| 6,671,567 B1 | 12/2003 | Dwyer et al. | |
| 6,694,200 B1 | 2/2004 | Naim | |
| 6,779,115 B1 | 8/2004 | Naim | |
| 6,823,225 B1 | 11/2004 | Sass | |
| 7,065,417 B2 | 6/2006 | Moon et al. | |
| 7,294,776 B2 | 11/2007 | Tohgi et al. | |
| 2006/0271646 A1 | 11/2006 | Janky et al. | |
| 2009/0235039 A1* | 9/2009 | Hashimoto et al. | 711/165 |

FOREIGN PATENT DOCUMENTS

| | | |
|---|---|---|
| DE | 42 07 447 A1 | 9/1993 |
| DE | 295 19 214 U1 | 3/1996 |
| DE | 195 49 453 C2 | 5/1999 |
| DE | 299-10-175 | 10/1999 |
| DE | 200 18 559 U1 | 2/2001 |
| DE | 201 00 975 U1 | 5/2001 |
| DE | 101 12 673 A1 | 10/2001 |
| DE | 100 14 987 C2 | 2/2002 |
| EP | 0 467 208 A1 | 7/1991 |
| EP | 0 535 832 A1 | 4/1993 |
| EP | 0536792 A2 | 4/1993 |
| EP | 0 570 147 A2 | 11/1993 |
| EP | 0 570 191 B1 | 11/1993 |
| EP | 0637 796 A2 | 2/1995 |
| EP | 0639 895 A2 | 2/1995 |
| EP | 0 786 774 A2 | 7/1997 |
| EP | 0 798 929 B1 | 10/1997 |
| EP | 0 570 147 B1 | 8/2000 |
| EP | 1 018 117 B1 | 11/2001 |
| EP | 1 101 511 B1 | 3/2004 |
| GB | 2 115 996 A | 9/1983 |
| GB | 2 259 379 A | 3/1993 |
| JP | 58068259 | 4/1983 |
| JP | 1027061 | 1/1989 |
| JP | 1205630 | 8/1989 |
| JP | 3230319 | 10/1991 |
| JP | 3235109 | 10/1991 |
| JP | 4061069 A | 2/1992 |
| JP | 4349269 A | 12/1992 |
| JP | 05-135228 | 1/1993 |
| JP | 5036293 A | 2/1993 |
| JP | 5217292 | 8/1993 |
| JP | 05-242688 | 9/1993 |
| JP | 5266645 | 10/1993 |
| JP | 5314655 A | 11/1993 |
| JP | 05-346800 | 12/1993 |
| JP | 05334893 A2 | 12/1993 |
| JP | 07-176175 | 7/1995 |
| JP | 7244967 | 9/1995 |
| JP | 7-307674 | 11/1995 |
| JP | 07-325600 | 12/1995 |
| JP | 07-334456 | 12/1995 |
| JP | 07-334972 | 12/1995 |
| JP | 08-084315 | 3/1996 |
| JP | 8084315 | 3/1996 |
| JP | 08-115100 | 5/1996 |
| JP | 8 205093 | 8/1996 |
| JP | 08-223524 | 8/1996 |
| JP | 8202499 A | 8/1996 |
| JP | 09-007352 | 1/1997 |
| JP | 09-0022588 | 1/1997 |
| JP | 09-022589 | 1/1997 |
| JP | 9-73299 | 3/1997 |
| JP | 10-320000 | 12/1998 |
| JP | 11259979 | 9/1999 |
| JP | 3164089 | 5/2001 |
| JP | 2002279730 | 9/2002 |
| JP | 2002334521 | 11/2002 |
| KR | 10-1991-11772 | 2/1992 |
| KR | 10-1995-35692 | 5/1997 |
| WO | WO-92/11626 | 7/1992 |
| WO | WO 96 08006 | 3/1996 |
| WO | WO 96 25738 | 8/1996 |
| WO | WO-97/00484 | 1/1997 |
| WO | WO 97 26744 | 7/1997 |
| WO | WO-97/33220 | 9/1997 |
| WO | WO-98/06182 | 2/1998 |
| WO | WO 99 18075 | 4/1999 |
| WO | WO-00/60599 | 10/2000 |
| WO | WO-00/67261 | 11/2000 |

OTHER PUBLICATIONS

Windows Media Player 5.1 software application (screenshots)—Release Date: believed to be 1995 (7 pgs).
WinPlay 2.3 Beta 5 software application (screenshots)—Release Date: believed to be May 1997 (14 pgs).

(56) References Cited

OTHER PUBLICATIONS

Winamp Version 1.55 software application (screenshots)—Release Date: believed to be Oct. 7, 1997 (5 pgs).
Maplay 1.2 software application (screenshots)—Release Date: believed to be Dec. 14, 1997 (8 pgs).
Sonique 0.55 software application (screenshots)—Release Date: believed to be Sep. 25, 1998 (14 pgs).
RealPlayer G2 software application (screenshots)—Release Date: believed to be Mar. 3, 1999 (9 pgs).
Sony Corporation, Sony Compacy Disk Compact Player, Operating Instructions, 1996, 26 Pages.
In the U.S. Appl. No. 11/411,546, Non-Final Office Action dated Feb. 3, 2010, 5 pages.
In the U.S. Appl. No. 11/586,463, Non-Final Office Action dated Jan. 25, 2010, 5 pages.
In the U.S. Appl. No. 11/648,410, Non-Final Office Action dated May 26, 2010, 5 pages.
In the U.S. Appl. No. 11/648,412, Non-Final Office Action dated Jun. 9, 2010, 5 pages.
In the U.S. Appl. No. 11/648,427, Non-Final Office Action dated Jun. 17, 2010, 5 pages.
In the Re-Examination U.S. Appl. No. 95/000,278, Non-Final Office Action dated Nov. 8, 2007, 52 pages; and corresponding response dated Feb. 25, 2008, 69 pages.
In the Reexamination U.S. Appl. No. 95/000,278, Non-Final Office Action dated Mar. 19, 2009, 82 pages; and corresponding response dated May 19, 2009, 52 pages.
In the Reexamination U.S. Appl. No. 95/000,278; Action Closing Prosecution (Non-Final) dated Jan. 15, 2010, 98 pages.
In the Reexamination U.S. Appl. No. 95/000,278 Applicant's Response to Action Closing Prosecution (Non-Final) dated Feb. 16, 2010, 24 pages.
"Apple Computer, Inc. Q4 2005 Unaudited Summary Data"; http://images.apple.com/pr/pdf/q405data_sum.pdf.
"Apple Computer, Inc. Q4 2006 Unaudited Summary Data"; http://images.apple.com/pr/pdf/q403data_sum.pdf.
"Apple Computer, Inc. Q4'03 Summary Data"; http://images.apple.com/pr/pdf/q403data_sum.pdf.
"Apple Computer, Inc. Q4'04 Unaudited Summary Data"; http://images.apple.com/pr/pdf/q404data_sum2.pdf.
"Apple Inc. Q1 2008 Unaudited Summary Data"; http://images.apple.com/pr/pdf/q108data_sum.pdf.
"Apple Inc. Q4 2007 Unaudited Summary Data"; http://images.apple.com/pr/pdf/q407data_sum.pdf.
"Apple Reports First Quarter Profit of $38 Million"; http://www.apple.com/pr/library/2002/jan/16results.html.
"Audible MobilePlayer and MobilePlayer—Plus User's Guide"; *Audible, Inc.,* 1997; pp. 1-7.
"Identifying iPod Models"; http://docs.info.apple.com/article.html?artnum=61688.
"iPod 101: Beef Up My Battery"; http://docs.info.apple.com/article.html?artnum=304681.
"iPod Family"; http://www.apple.com/batteries/ipods.html.
"iPod Features Guide"; 5th Generation (Late 2006).
"iPod: About the Equalizer"; http://docs.info.apple.com/article.html?artnum=61567.
"MP3"; http://en.wikipedia.org/wiki/MP3.
"MPMan.com is World Leader in Portable MP3 Player Market"; *The Korea Herald*; Mar. 30, 2000.
"NEC Develops Flash-Memory Personal Stereo"; *Audio Week*; Dec. 1994; vol. 6, No. 47.
"NEC Unveils its Miniature Digital Videos. Music Player"; *Billboard*; Oct. 1995; p. 10.
"Portable Stereo from Memory Chip Card"; *Screen Digest*; Jan. 1995.
"Portable Translator"; *IBM Technical Disclosure Bulletin*; Nov. 1994; pp. 185-186.
"Portable Voice Messaging System"; *IBM Technical Disclosure Bulletin*; Jul. 1995; pp. 257-260.

"Saehan Info Systems Humming to Tune of MP3 Digital Music Korea Times"; *Korea Times*; May 5, 1999.
"Saehan Leads Digital Music Revolution"; *Business Korea*; Aug. 1999; p. 41.
"Saehan Media America Deploys MP3.com's MSP Services; MP3.com Provides Consumers with Customizable Music Content Solutions"; *PR Newswire*; May 5, 2000.
"Single-chip Solution for Audio Data Decompression with MPEG Layer 3 Method"; *ITT Semiconductors, Catalogue of MAS 3503 C*; Feb. 1995; pp. 1-8.
"Songs and Albums FAQ"; http://www.apple.com/support/itunes/store/songs/.
"Texas MP3 Technologies, LTD"; http://texasmp3technologies.com/news.html.
"The Silicon Audio: An Audio-Data Compression and Storage System with a Semiconductor Memory Card"; *IEEE Transactions on Consumer Electronics*; Feb. 1995; vol. 41, No. 1; pp. 186-194.
"Virtual Jukebox"; *Google Groups*; Aug. 3, 1997.
Beuthner, Andreas; "Chips for MP3"; Fraunhofer Magazine; Feb. 2000; at http://www.fraunhofer.de/fhg/archiv/magazin/phlege.av.fhg.de/english/publications/df/df2000/magazine2_2000_t24.html.
Coventry, Joshua; "Apple's Climb Back to Success, 1999 to 2001"; Oct. 2006; http://www.lowendmac.com/coventry/06/1013.html.
Coxwell, Hylton; "MPlayer3"; *The Review*; Nov. 23, 1999; also at http://legacy.macnn.com/thereview/reviews/mplayer3/mplayer3.shtml.
Dean, Rich; "RIO"; *NPR Weekend Edition Sunday*; Nov. 1, 1998.
Defendants, Samsung Electronics Co., Ltd., Samsung Electronics America, Inc.'s First Amended Answer to Plaintiff's Complaint for Patent Infringement and Jury Demand (dated Jul. 6, 2007).
Defendants, Samsung Electronics Co., Ltd., Samsung Electronics America, Inc., SanDisk Corporation and Apple, Inc.'s Second Supplemental Invalidity Contentions attaching Appendix A which includes Exhibits 1-46, Appendix B and Appendix C; (Dated: Nov. 2, 2007).
Defendants, Samsung Electronics Co., Ltd., Samsung Electronics America, Inc., SanDisk Corporation and Apple, Inc.'s Second Supplemental Invalidity Contentions, attaching Exhibits 44-57 (Dated: Nov. 2, 2007).
Defendants, Samsung Electronics Co., Ltd., Samsung Electronics America, Inc. SanDisk Corporation, Apple, Inc.'s invalidity Contentions, attaching Exhibits 1-43; (Dated: Sep. 24, 2007).
Hutchnson, Alex; "The Top 50 Inventions of the Past 50 Years"; *Popular Mechanics*; Dec. 2005.
Iwadere et al; "Compact Multimedia Players with PC Memory Cards Silicon View and Shopping Navigation"; *IEEE;* 1997; pp. 451-456.
Koitabashi, Taro, "Portable Audio Players Go Mainstream Big Names Like Sony and Matsushita Set to Market So-Called MP3 Piayers, Which Download Music"; *The Nikkei Weekly* (Japan); Dec. 20, 1999.
Levy, Steven; "The Perfect Thing; How the iPod Shuffles Commerce, Culture, and Coolness"; 2007; Simon & Schuster; pp. 48-49.
Scott, Ajax; "MW Comment Facing Format Revolution", *Music Week*; Aug. 8, 1998.
Sugiyama et al; "A New Implementation of the Silicon Audio Player Based on MPEG/Audio Decoder LSI"; *IEEE;* Mar. 1997; pp. 207-215.
Wampold, J.; *Progressive Networks and Audible Inc. Team Up to Make Real Audio Mobile*; Sep. 15, 1997.
In the U.S. Appl. No. 11/411,546, Non-Final Office Action, dated Nov. 15, 2010, 19 pages.
In the U.S. Appl. No. 11/586,463, Non-Final Office Action, dated Oct. 28, 2010, 24 pages.
In the U.S. Appl. No. 11/648,427, Non-Final Office Action, dated Mar. 22, 2011, 24 pages.
In the U.S. Appl. No. 11/648,410, Non-Final Office Action, dated Mar. 7, 2011, 18 pages.
In the U.S. Appl. No. 11/648,412, Non-Final Office Action, dated Mar. 7, 2011, 4 pages.
In the Reexamination U.S. Appl. No. 95/000,278, Right of Appeal Notice, dated Sep. 30, 2010, 22 pages.

(56) References Cited

OTHER PUBLICATIONS

The Complaint for Patent Infringement filed by Patent Owner in *Texas MP3 Technologies, Ltd.* v. *Samsung Electronics Co., Ltd.,* Samsung Electronics America, Inc., SanDisk Corp., and Apple Computer, Inc., Civil Action No. 2:07-CV-052-TJW (Eastern District of Texas), filed Feb. 16, 2007.
In the U.S. Appl. No. 11/586,462, Non-Final Office Action, dated Jan. 21, 2010, 4 pages.
In the U.S. Appl. No. 11/586,462, Non-Final Office Action, dated Oct. 27, 2010, 32 pages.
In the U.S. Appl. No. 11/586,462, Final Office Action, dated Jul. 8, 2011, 35 pages.
In the U.S. Appl. No. 11/586,463, Final Office Action, dated Jun. 28, 2011, 26 pages.
In the U.S. Appl. No. 11/648,410, Non-Final Office Action, dated Aug. 19, 2011, 2 pages.
U.S. Appl. No. 11/648,412, Final Office Action dated Jan. 17, 2014, 6 pages.
U.S. Appl. No. 11/648,412, Office Action dated Mar. 7, 2011, 5 pages.
U.S. Appl. No. 11/648,412, Office Action dated Sep. 20, 2012, 6 pages.
U.S. Appl. No. 11/648,412, Office Action dated Jun. 10, 2013, 6 pages.
U.S. Appl. No. 95/000,278, PTAB Appeal Decision dated Jan. 28, 2014, 23 pages.

* cited by examiner

PORTABLE SOUND REPRODUCING SYSTEM AND METHOD

CROSS-REFERENCE TO RELATED APPLICATION(S)

This application is a Continuation patent application of and claims priority from U.S. patent application Ser. No. 11/586,462, filed on Oct. 25, 2006, now U.S. Pat. No. 8,116,890, which is incorporated by reference in its entirety, and which is a Continuation patent application of and claims priority from U.S. patent application Ser. No. 11/411,546, filed on Apr. 26, 2006, and entitled PORTABLE SOUND REPRODUCING SYSTEM AND METHOD, now U.S. Pat. No. 8,170,700, which is incorporated by reference in its entirety, and which is a Continuation patent application of and claims priority from U.S. patent application Ser. No. 10/059,777 filed on Jan. 29, 2002 and entitled "MPEG PORTABLE SOUND REPRODUCING SYSTEM AND A REPRODUCING METHOD THEREOF," now U.S. Pat. No. 7,065,417, which is incorporated herein by reference in its entirety, and which is a Divisional patent application of U.S. patent application Ser. No. 09/061,647 filed on Apr. 17, 1998, now U.S. Pat. No. 6,629,000, and entitled "MPEG PORTABLE SOUND REPRODUCING SYSTEM AND A REPRODUCING METHOD THEREOF," which is incorporated herein by reference, and which claims priority to and incorporates by reference Korean Patent Application No. 97-62315 filed on Nov. 24, 1997.

BACKGROUND

1. Field of the Disclosure

The present disclosure generally relates to a portable sound reproducing system and method.

2. Description of the Related Art

Generally, data processed to be listened or viewed is stored in a memory medium then output through a reproduction device. The most common examples include analog data stored on magnetic tape which is output through a cassette player, and digital data stored on a compact disc which is output through a compact disc player.

Recent developments in digital technology has enabled memory media used in personal computers to undergo vast improvements. Namely, memory media used in PCs are becoming increasingly lightweight and compact, and providing the user with more capacity to store memory.

However, with the increase in required memory needed to run operating systems and application software, there is a limit to how efficiently memory media can be used. In an attempt to remedy this problem, a variety of methods have been devised to enable the efficient use of digital data. The MPEG standard is one of these methods which increases the storage capacity of memory media by compressing data stored therein.

Namely, by using the MPEG method of compressing data, data is compressed to roughly one-twelfth its original size without compromising sound or visual quality. After compressing data utilizing software or hardware made for this purpose, the data is then stored in a storage medium, then converted back into its original state using the MPEG method such that the data is placed in a form that can be heard or seen by the user. The MPEG method, therefore greatly increases data storage capacity.

With all the conventional sound reproduction systems, i.e., tape players and compact disc players, and PCs, etc. which are equipped with the capability to reproduce MPEG-compressed data, many disadvantages are encountered by the user.

In particular, in using cassette players, which reproduce data stored on magnetic tape, because the same amount of time is needed to store (record) data as it does to reproduce (play) the data, the storing process is time-consuming, and heat generated during the process acts to deteriorate the quality of the recording such that the quality of the sound reproduced is decreased. Moreover, because magnetic tape is easily worn, the repetitive playing of data stored on the cassette tape also acts to reduce sound quality.

Compact disc players and the discs used therein also have many problems. Namely, recording is not possible on compact discs. Further, because of the mechanical fragility of CD players, reproduction malfunctions occur when the players receive even slight outside shocks. Finally, CD players have a limited life span as the mechanical parts in the devices often break over time.

The storage media used in cassette and CD players also have the drawback of occupying much space. Also, users must take great care that the storage media are placed in an area that is not exposed to heat, direct sunlight, etc.

With regard to prior art devices such as PCs used to reproduce data stored using the MPEG method, as these devices are not portable, the location at which users can access the sound and images is limited to the location of the device. In addition, when using a PC to reproduce data compressed using the MPEG method, the cost of equipping the PC with software or hardware to enable this function is high. Also, because various types of sound data are stored on a plurality of storage media, the user must purchase many kinds of storage media and undergo complicated processes to reproduce the data stored therein.

Finally, in all of the above cases, users must physically go to retail stores to purchase storage media, causing inconvenience to the user.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DESCRIPTION OF THE DRAWINGS

Preferred embodiments of the present invention will now be described in detail with reference to the accompanying drawings.

Figure 1:
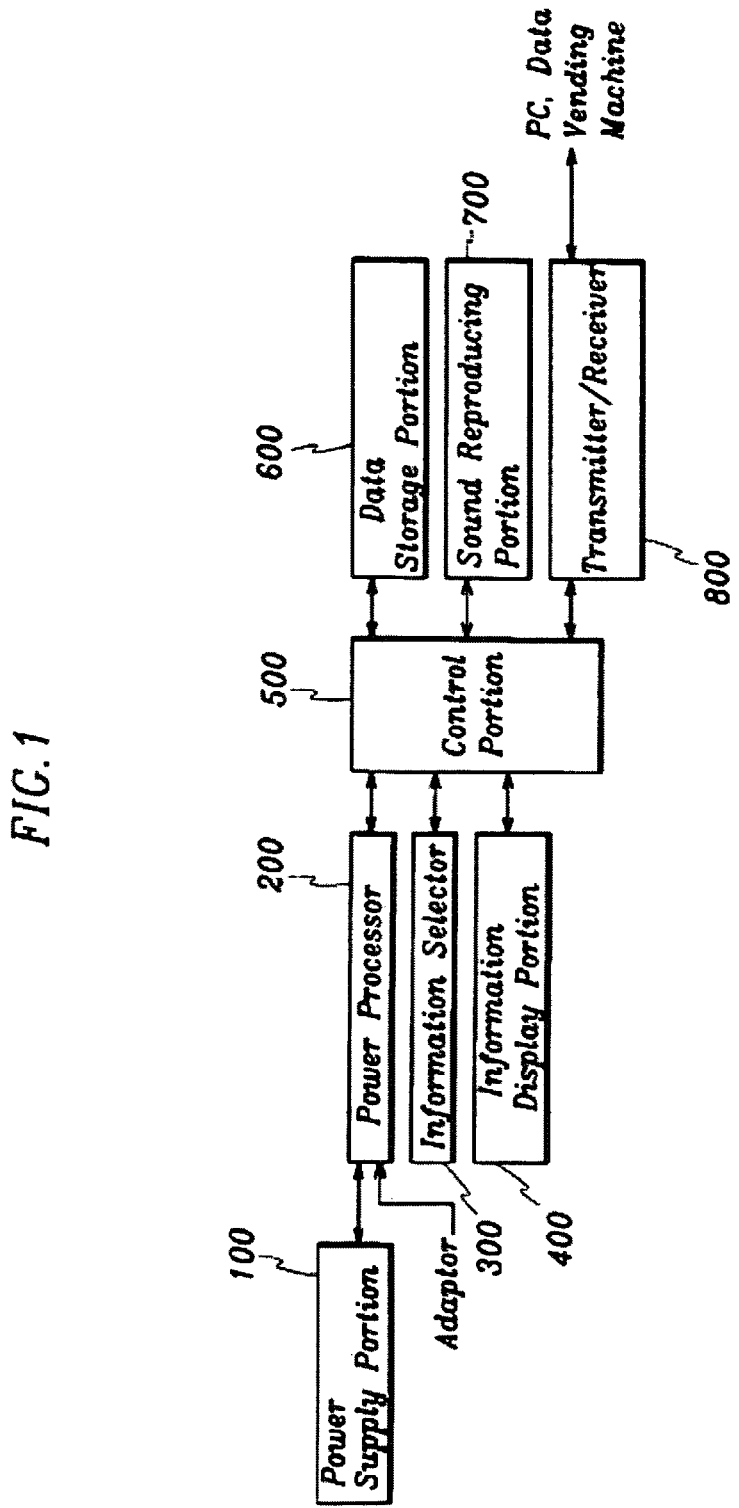
FIG. 1 is a block diagram of an MPEG portable sound reproducing system according to a preferred embodiment of the present invention.

Referring first to FIG. 1, an inventive MPEG portable sound reproducing system comprises a power supply portion 100, a power processor 200, an information selector 300, an information display portion 400, a control portion 500, a data storage portion 600, a sound reproducing portion 700, and a transmitter/receiver 800.

The power supply portion 100 is realized through a nickel-cadmium (Ni-CD), nickel-metal hydride (Ni-MH), lithium-ion, or lithium-polymer secondary battery, and converts chemical energy into electrical energy for supply of the same to the portable sound reproducing system. Also, the power supply portion 100 is recharged by electricity received through an adaptor.

The power processor 200 receives power from the power supply portion 100 or directly through the adaptor, rectifies the power to stable voltage current, and supplies the power to the control portion 500 as drive power. When receiving power through the adaptor, the power processor 200 supplies power to the power supply portion 100 for recharging the same.

The information selector 300 is realized through various predetermined keys operated by the user, and outputs electrical signals according to the user selections to control the supply of power, extract data for reproduction, control various functions related to the reproduction of data, and transmit and receive data.

In more detail, the information selector 300 comprises a forward switch for advancing to a subsequent selection when pressed for under a predetermined amount of time of preferably under one second, and which quickly plays data when continually pressed for a predetermined amount of time of preferably over one second; a reverse switch for returning to a beginning of a present selection if the selection is in mid-play or reversing to a previous selection if between selections when pressed for under a predetermined amount of time of preferably under one second, and which quickly plays data in reverse when continually pressed for a predetermined amount of time of preferably over one second; a play/stop switch for reproducing data when pressed one time, and, in a state of reproducing data, discontinuing the present play mode when pressed again, then cutting off the power; a repeat switch for replaying the present selection when pressed one time, repeating all selections when pressed two times, and canceling all repeat commands when pressed for a predetermined time of preferably over three seconds; and a random switch for randomly reproducing the selections in a random order when pressed.

The information display portion 400 is realized through an LCD (liquid crystal display) and displays various numbers and letters related to the various modes realized through the above switches.

Figure 2:
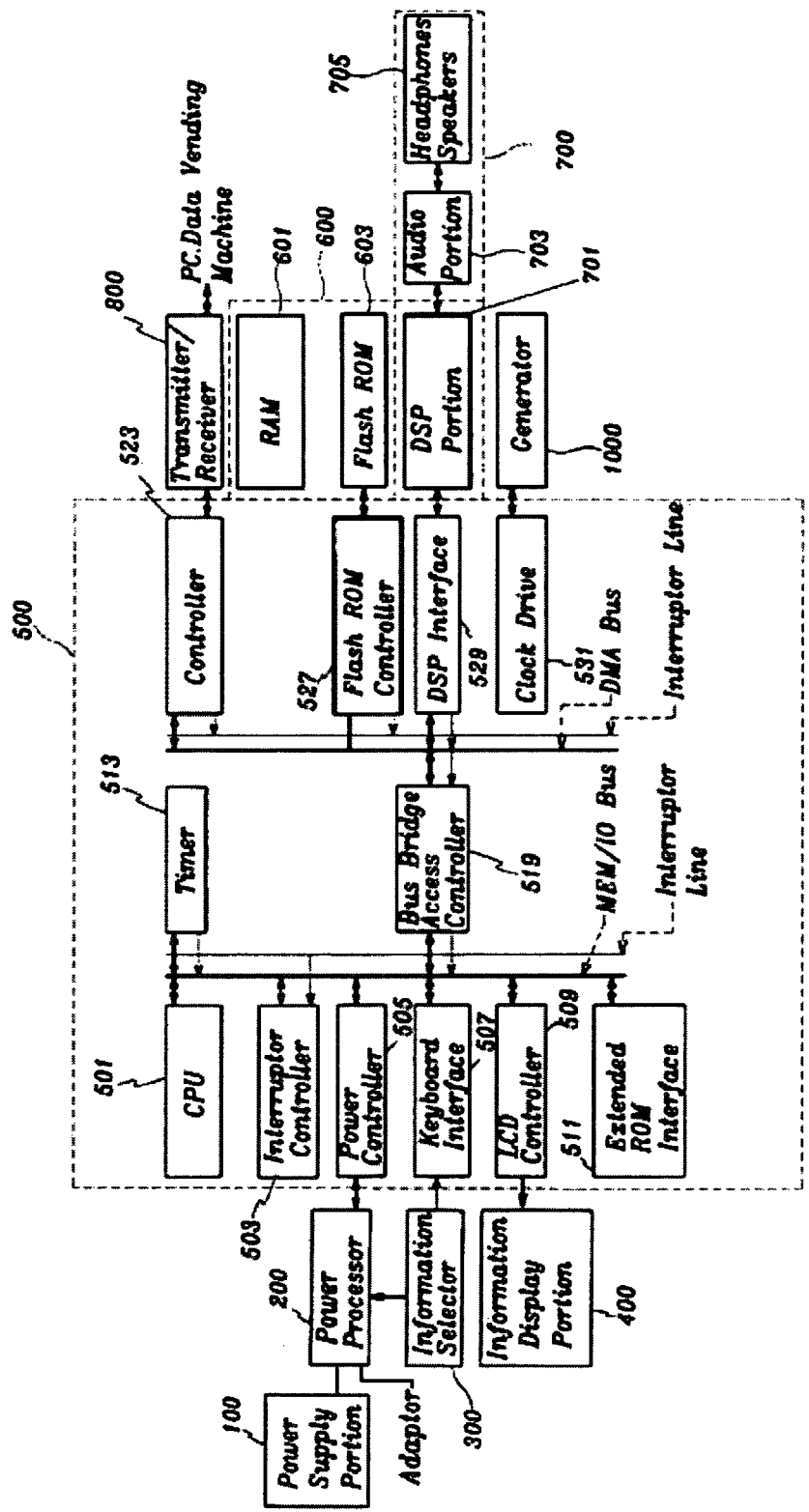
FIG. 2 is a detailed block diagram of the MPEG portable sound reproductin system of FIG. 1.
Figure 3A:
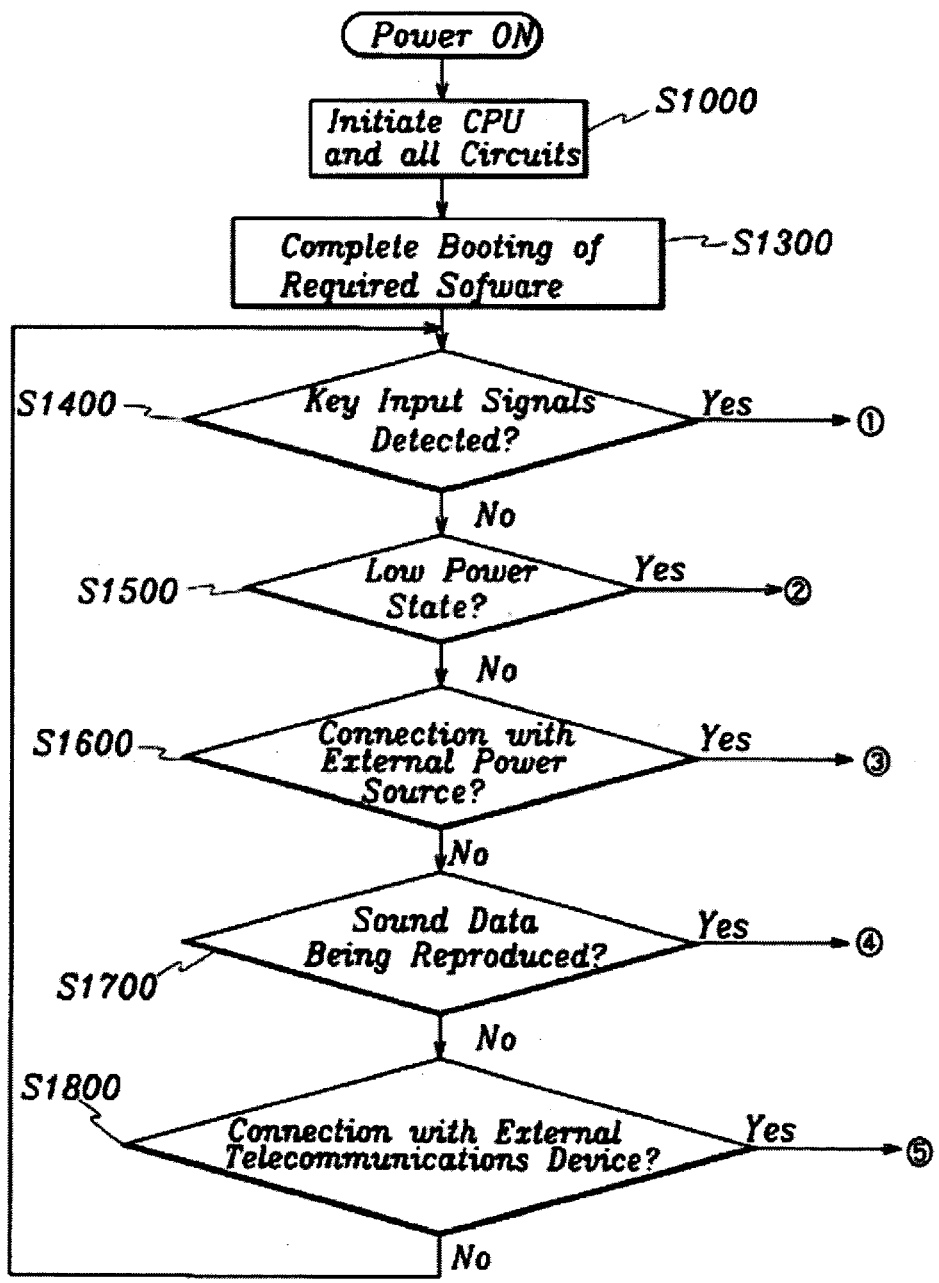
FIGS. 3a-3f are flow charts of a reproducing method for an MPEG portable sound reproducing system according to a preferred embodiment of the present invention.
Figure 3B:
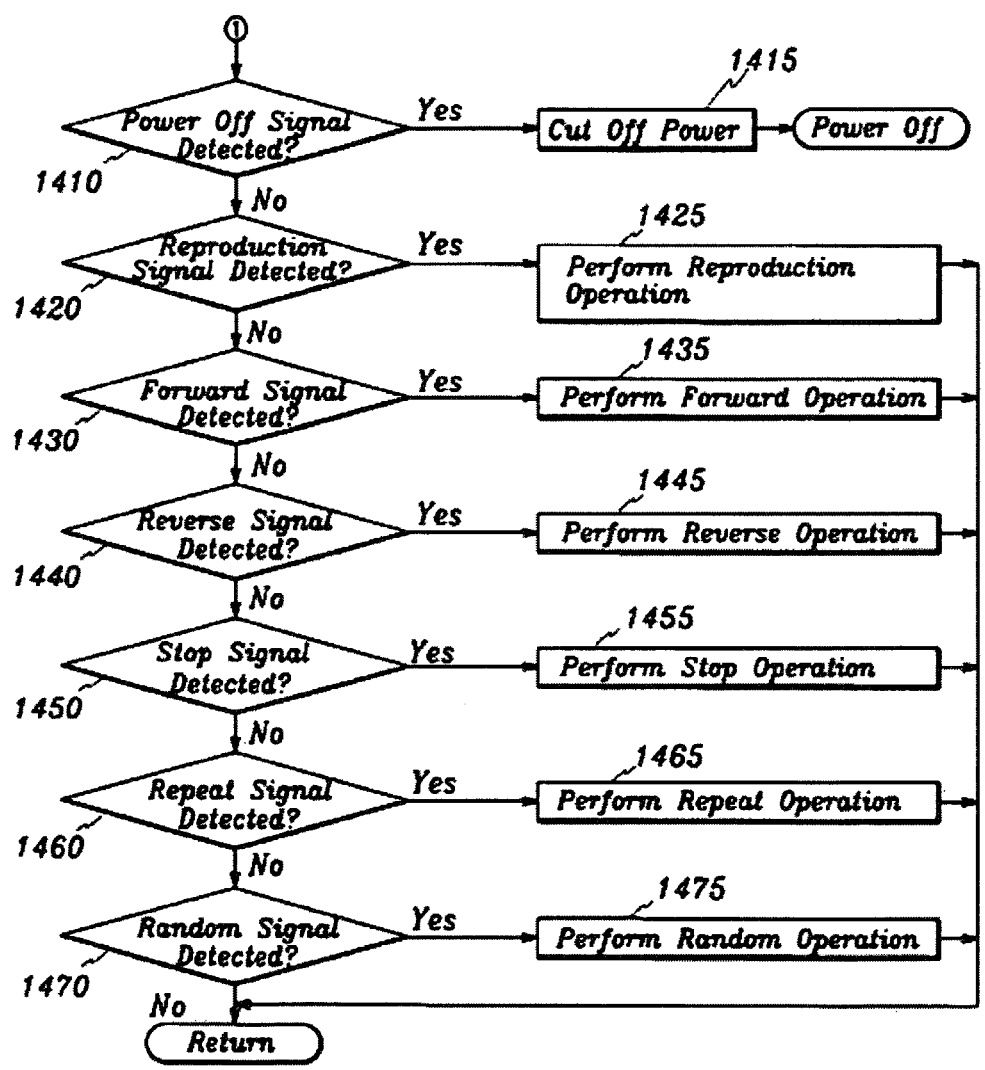
Figure 3C:
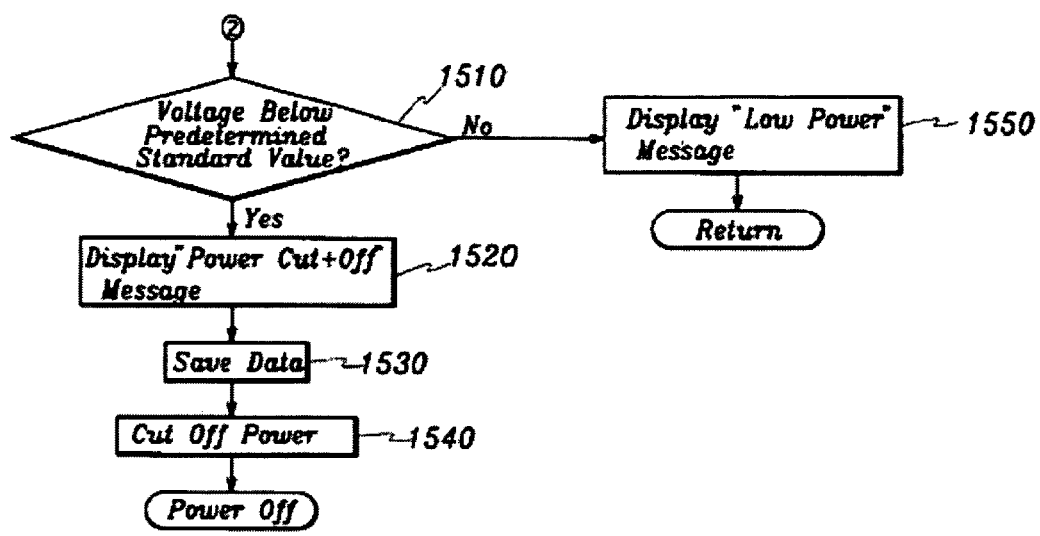
Figure 3D:
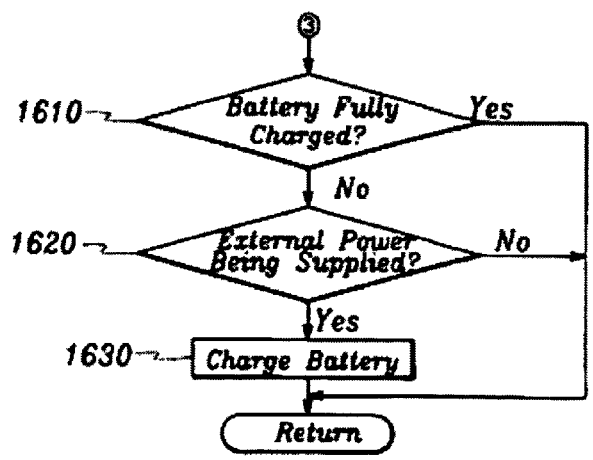
Figure 3E:
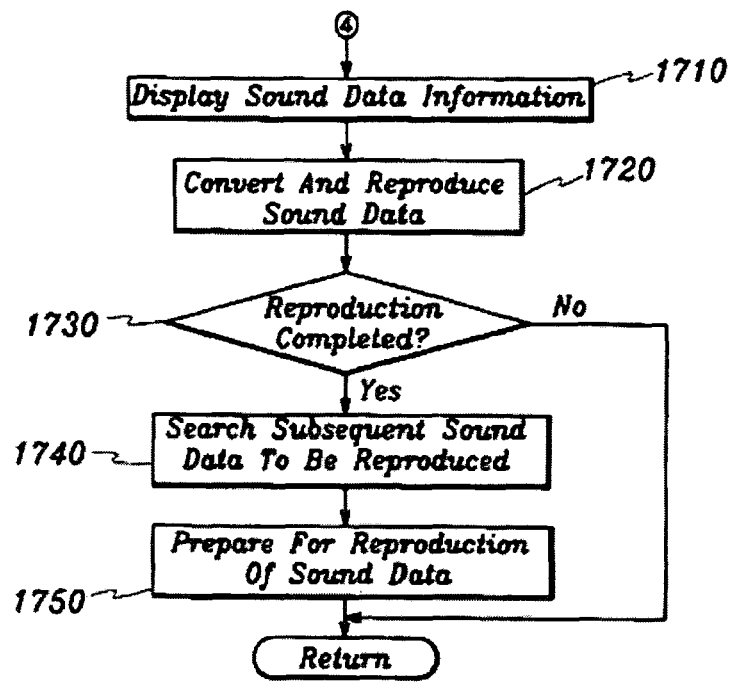
Figure 3F:
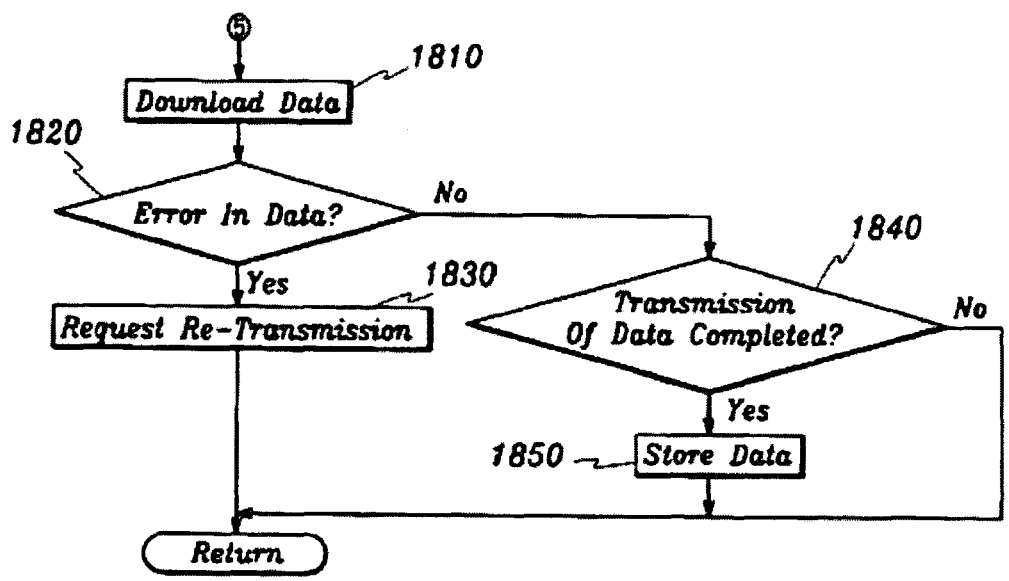

The control portion 500 controls all the various operations for storing and reproducing sound data compressed using the MPEG method. The control portion 500, as shown in FIG. 2, comprises a CPU (central processing unit) 501 for controlling operations related to converting digital data stored using the MPEG method into an audible format; an interrupter controller 503 for outputting a control signal to control the CPU 501 when an input/output operation is ended or an error occurs in the same; a power controller 505 for outputting control signals to stably supply power applied from the power processor 200 as operational power of the CPU 501, and cutting off power when an error occurs; a keyboard interface 507 for interfacing key select signals applied from the information selector 300; an LCD controller 509 for controlling electric current supplied to a matrix of the information display portion 400 to control display during operation of the inventive sound reproducing system; an extended ROM interface 511 for interfacing a with an extended ROM, added to extend a scope of programs or memory, and a flash memory; a timer 513 for counting time information needed for data downloading and reproducing the downloaded data, and data interrupting required to operate the system; a bus bridge access controller 519 outputting control signals for controlling a bus, the bus transmitting data; a controller 523 for controlling input/output of data transmitted and received; a flash ROM controller 527 for activating the flash ROM 603 according to interrupter control signals applied from the CPU 501; a DSP (digital signal processor) interface 529 outputting control signals for controlling an input/output of digital sound data compressed by the MPEG method; and a clock drive 531 which processes a generator clock of a generator 1000 to a predetermined state and drives the same to the CPU 501 as clock signals.

All the above elements of the control, portion 500 are connected through a combination of an interrupt line and an I/O bus.

The data storage portion 600 stores sound data compressed using the MPEG method downloaded through the transmitter/receiver 800 according to signals from the control portion 500. Further, as shown in FIG. 2, the data storage portion 600 is realized through the flash ROM 603, which is a volatile memory element that does not lose data when the power is cut off, for storing and erasing sound data, and data related to application software and other digital data.

The sound reproducing portion 700 converts sound data stored in the data storage portion 600 into an audible format according to signals applied from the control portion 500. The sound reproducing portion 700, as shown in FIG. 2, comprises a DSP portion 701 for returning digital sound data compressed using the MPEG method to its initial state, an audio portion 703 which converts sound signals input from the DSP portion 701 into an audible format, and headphones/speakers 705 for converting electric sound signals input from the audio portion 703 into sound able to be heard by users.

The transmitter/receiver 800 is connected to a PC, data vending machine, or other such external devices and either transmits sound or program data thereto or receives sound or program data therefrom. A preferred reproducing method of data compressed using the MPEG method for the portable sound reproducing system structured as in the above will be described hereinafter with reference to FIGS. 3a-3f.

First, if the user presses an ON switch of the information selector 300 to reproduce and listen to particular sound data among all the digital data compressed using the MPEG method and stored in the data storage portion 600, the CPU 501 of the control portion 500 enters an operational mode by receiving power via the power processor 200 from the power supply portion 100 or adaptor (S1000).

Next, the CPU 501 runs the main program and completes booting of required software (S1300), then determines if key signals of the information selector 300, input through the keyboard interface 507 and the MEM/IO bus, are detected (S1400).

If key signals are detected in step S1400, it is determined if there is a power OFF selection signal, selected by the user to cut off power supplied from the power processor 200 (S1410). If the power OFF signal is detected, operational power applied from the power processor 200 is cut off and the system is put in a standby mode (S1415).

If no power OFF signal is detected in step S1400, it is detected if there has been an input of a sound reproduction signal for restoring and reproducing a selection of data compressed using the MPEG method and stored in the flash ROM 603 of the data storage portion 600 (S1420).

If it is determined in step 1420 that the key signal is a reproduction key signal to reproduce sound data stored in the data storage portion 600, the CPU 501 loads the selected sound data to the DSP portion 701 of the sound reproducing portion 700 via the DSP interface 529 of the control portion 500, then returns the digital sound data compressed using the MPEG method to its original state using operating systems software, converts the data into an electric sound signal through the audio portion 703 of the sound reproducing portion 700, and converts the electric signal into a sound signal audible to the user and outputs the same through headphones/speakers 705 (S1425).

In step 1420, if it is detected that the key select signal is not a signal for reproducing sound data or if the system is currently reproducing data, it is then detected if a forward signal has been input (S1430). If a forward key signal is detected in step S1430, the CPU 501 determines if the forward select signal is transmitted for under a predetermined amount of time of less than one second, which if this criterion is met, then advances the selection to the next selection and executes a reproducing operation, and also determines if the forward select signal is transmitted for over a predetermined amount of time of more than one second, and if it is, the present selection is reproduced at a fast speed (S1435).

In step S1430, if a forward key signal is not detected, it is determined if a reverse key signal has been input (S1440). If it has, the current selection being reproduced is either returned to the beginning, or if between selections, a selection is made to the preceding song if the reverse signal is transmitted for under a predetermined time of preferably under one second, or the present playing selection is quickly reversed if the reverse signal is transmitted for over a predetermined amount of time of preferably over one second (S1445).

If a reverse signal is not detected in step 1440, it is then detected if a stop signal has been input (S1450). Here, if a stop signal is detected, it is further determined, using an installed program, if a signal of a predetermined number of times of preferably one time has been input and the present mode is the play mode, in which case the present reproduction operation is discontinued, an if in a stopped mode reproduction is started. Further, in a state where the play mode has been discontinued, if it is detected that the stop signal is transmitted for a predetermined amount of time of preferably more than three seconds, standby power is controlled to OFF (S1455).

In step S1450, if a stop signal is not detected or if it is determined that the system is in a play mode, it is then determined if a repeat signal has been input (S1460). If a repeat signal is detected, the number of input times is determined using an installed program such that the present selection is repeated when it is detected that the signal has been input a predetermined number of times of preferably one time, all sound data stored in the memory of the flash ROM 603 is repeated when the input of two signals is detected, and any repeat command is cancelled when it is detected that the signal is input during a repeat operation (S1465).

Further, if no repeat signal is detected in step 1460, it is then determined if a random signal has been input (S1470). If a random signal is detected in this step, selections are reproduced in random order (S1475), and if a random signal is not detected, the operation to reproduce the sound data compressed using the MPEG method is repeated.

In the above state where sound data selected by the user is being reproduced according to key signals input from the information selector 300, operational power is analyzed in the power processor 200 to determine if a Low Power state exists, disenabling a reproduction operation to be performed, in the power supply portion 100 (S1500). If it is determined that the power supply portion 100 is in a Low Power state in step 1500, it is then determined if the detected present voltage is below a predetermined standard value that would impede the normal reproducing of sound data (S1510).

In the above, if it is determined that the voltage of the power supply portion 100 is less than the predetermined standard value, the control portion 500 outputs a predetermined control signal for display of a warning to the LCD controller 509 via the MEM/IO bus. Here, the LCD controller 509 adjusts power supplied to the matrix of the information display portion 400 such that a "power cut off" message is displayed thereon (S1520).

Simultaneously with the displaying of the "power cut off" message, the CPU 501 of the control portion 500 inputs a data storage signal to the flash ROM 603 of the data storage portion 600 such that the present state is saved (S1530), and controls the power controller 505 via the MEM/IO bus to cut off the supply of power to the power processor (S1540).

In step 1510, if it is determined that the voltage of the power supply portion 100 is above the predetermined standard value, enabling the normal operation of the system, the control portion 500 controls the information display portion 400 via the LCD controller 509 such that a "Low Power" message is displayed (S1550).

After the checking of the power state in step S1500, the CPU 501 of the control portion 500 determines if the power processor 200 is connected to an external power source through the adaptor (S1600). If it is detected that there is a connection with an external power source in step S1600, it is then determined if the power supply portion 100 is fully charged (S1610).

In the above, if it is determined that the power supply portion 100 is fully charged, the charging operation is discontinued, to prevent damage to the power supply portion 100 caused by overcharging, and if it is determined that the power supply portion 100 is not fully charged, it is then determined if power from an external power source is being supplied through the adaptor (S1620). Here, if external power is being supplied in a state where the power supply portion 100 is not fully charged, the power is then supplied to the power supply portion 100 to charge the same (S1630).

After step 1600, where it is determined if there is a connection with an external power source, it is then determined if sound data is being reproduced according to selections made by the user at the information selector 300 (S1700). If sound data is being reproduced in this step, the CPU 501 of the control portion 500 analyzes the sound data checking, for example, data reproduction time, title of selection, type of music, remaining play time for the selection, etc.—and displays the information through the information display portion 400 by controlling the LCD controller 509 (S1710).

Further, the CPU 501 of the control portion 500 accesses the sound data compressed using the MPEG method in the flash ROM 603 of the data storage portion 600, and transmits this sound data to the DSP portion 701 of the sound reproducing portion 700 through the DSP interface 529. Accordingly, the DSP portion 701 processes the MPEG-compressed digital sound data to a predetermined state and converts it to sound signals via the audio portion 703, then reproduces the sound data through headphones/speakers 705 such that the user can listen to the sound (S1720).

Next, it is determined if the selected sound data has been completely reproduced (S1730). If it has, a subsequent sound data selection is searched from the flash ROM 603 (S1740), then sound data to be reproduced is loaded from the flash ROM 603 and preparations are made to reproduce sound data (S1750).

After step S1700, where it is determined if sound data is being reproduced, the CPU 501 of the control portion 500 analyzes signals from the controller 523 to determine if the transmitter/receiver 800 is connected to an external telecommunications system of, for example, a computer having a modem or other telecommunications device installed therein, or a data vending machine selling a variety of data and programs of music, video games, etc. (S1800).

If it is determined in step 1800 that the transmitter/receiver 800 is connected to an external telecommunications system, the inventive system is changed to a downloading load, the data is downloaded (S1810), and it is determined if an error exists in the downloaded data (S1820).

In the above, if it is determined that an error exists in the downloaded data, the CPU 501 of the control portion 500 performs control so that the data is re-transmitted, and if no error exists in the data, the data is stored (S1830). Further, if it is determined that no error exists in the transmitted data in step 1820, the CPU 501 determines if transmission of the data is completed (S1840), designates an address sphere in the data storage portion 600, then downloads and stores the data (S1850).

In the MPEG portable sound reproducing system structured and reproducing MPEG-compressed data as in the above, as sound data is compressed using the MPEG method and stored in a semiconductor chip or other memory element, then reproduced in a format audible to the user, convenience is provided by eliminating the need for records, tapes, CDs, and other such memory media, and many of the drawbacks of using memory media in prior art reproduction devices—reduction in sound quality after recording or repeated playing, fragility of memory media necessitating the need to take great care in storing the same, etc.—are overcome.

Further, because it is possible to connect the inventive system to telecommunications networks and data vending machines to download various data, benefits of speed, convenience, and low cost are provided to the user.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A portable audio device suitable for reproducing MPEG encoded data, the portable audio device comprising:
    a plurality of inputs, including a forward input, a reverse input, a play control input, and a random input;
    a non-removable data storage to store compressed digitized audio data;
    a display;
    an audio output;
    at least one processor, responsive to selection of at least one of the plurality of inputs, to convert selected compressed digitized audio data stored in the non-removable data storage for reproduction by the audio output and to provide information to the display;
    a battery; and
    wherein, when a first selection of compressed digitized audio data is being reproduced, the display provides the first selection's title;
    wherein, when a second selection of compressed digitized audio data is being reproduced and in response to selection of the forward input for a first amount of time, the portable audio device advances to another selection of compressed digitized audio data;
    wherein, when a third selection of compressed digitized audio data is being reproduced, in response to selection of the reverse input for a second amount of time, the portable audio device begins playing the third selection from a beginning of the third selection of compressed digitized audio data;
    wherein, when a fourth selection of compressed digitized audio data is being reproduced, in response to selection of the play control input, the portable audio device stops playing the fourth selection of compressed digitized audio data;
    wherein, in response to selection of the random input, the portable audio device reproduces selections of the compressed digitized audio data stored in the non-removable data storage in a random order; and
    wherein, when the portable audio device is in a selected mode of operation and a voltage of the battery falls below a selected level, the display provides an indication relating to a power level of the battery.

2. The portable audio device of claim 1, wherein the compressed digitized audio data is compressed according to a Moving Pictures Expert Group (MPEG) compression standard.

3. The portable audio device of claim 1, wherein:
    when the second selection of compressed digitized audio data is being reproduced and in response to selection of the forward input for a third amount of time, the portable audio device reproduces the second selection of compressed digitized audio data at a rapid speed;
    when the third selection of compressed digitized audio data is being reproduced, in response to selection of the reverse input for a fourth amount of time, the portable audio device begins advancing toward the beginning of the third selection.

4. The portable audio device of claim 1, wherein:
    when the portable audio device stops playing the fourth selection of compressed digitized audio data in response to selection of the play control input, a subsequent selection of the play control input causes the portable audio device to begin reproducing the fourth selection of compressed digitized audio data.

5. The portable audio device of claim 4, further comprising a plurality of buttons, including:
    a reverse button, wherein the reverse input is selected when the reverse button is depressed;
    a forward button, wherein the forward input, is selected when the forward button is depressed; and
    a play/stop button, wherein the play control input is selected when the play/stop button is depressed.

6. The portable audio device of claim 4, wherein the first time is less than the third time, and the second time is less than the fourth time.

7. The portable audio device of claim 4, wherein the first and second times are less than approximately 1 second and the third and fourth times are greater than approximately 1 second.

8. The portable audio device of claim 1, wherein selecting the play control input for an extended period turns the portable audio device off.

9. The portable audio device of claim 1, wherein the plurality of inputs includes a repeat input and wherein, in response to selection of the repeat input, the portable audio device reproduces at least one selection of the compressed digitized audio data stored in the non-removable data storage in a repetitive manner.

10. The portable audio device of claim 5, wherein the at least one processor includes first and second processors.

11. The portable audio device of claim 10, wherein the first processor determines which input signals are being selected, while the second processor decompresses the compressed digital audio data.

12. The portable audio device of claim 11, wherein the first processor functions as a CPU and the second processor functions as a DSP.

13. The portable audio device of claim 11, further comprising a transmitter/receiver for receiving compressed digital sound data from a personal computer.

14. The portable audio device of claim 1, further comprising a transmitter/receiver for receiving compressed digital sound data from a data vending machine attached to a telecommunications network.

15. A portable audio device suitable for reproducing MPEG encoded data, the portable audio device comprising:
a plurality of inputs, including a forward input, a reverse input, a play control input, and a random input;
a data storage to store compressed digitized audio data;
a display;
an audio output;
at least one processor, responsive to selection of at least one of the plurality of inputs, to convert selected compressed digitized audio data stored in the data storage for reproduction by the audio output and to provide information to the display;
a battery; and
wherein, when a first selection of compressed digitized audio data is being reproduced, the display provides at least one of the first selection's title or type;
wherein, when a second selection of compressed digitized audio data is being reproduced and in response to selection of the forward input for a first amount of time, the portable audio device advances forward to another selection of compressed digitized audio data;
wherein, when a third selection of compressed digitized audio data is being reproduced, in response to selection of the reverse input for a second amount of time, the portable audio device begins playing the third selection from a beginning of the third selection of compressed digitized audio data;
wherein, when a fourth selection of compressed digitized audio data is being reproduced, in response to selection of the play control input, the portable audio device stops playing the fourth selection of compressed digitized audio data;
wherein, in response to selection of the random input, the portable audio device reproduces selections of the compressed digitized audio data stored in the data storage in a random order; and
wherein, when the portable audio device is in a selected mode of operation and a voltage of the battery falls below a selected level, the display provides an indication relating to a power level of the battery.

16. The portable audio device of claim 15, wherein the compressed digitized audio data is compressed according to a Moving Pictures Expert Group (MPEG) compression standard.

17. The portable audio device of claim 15, wherein:
when the second selection of compressed digitized audio data is being reproduced and in response to selection of the forward input for a third amount of time, the portable audio device reproduces the second selection of compressed digitized audio data at a rapid speed;
when the third selection of compressed digitized audio data is being reproduced, in response to selection of the reverse input for a fourth amount of time, the portable audio device begins advancing toward the beginning of the third selection.

18. The portable audio device of claim 17, wherein:
when the portable audio device stops playing the fourth selection of compressed digitized audio data in response to selection of the play control input, a subsequent selection of the play control input causes the portable audio device to begin reproducing the fourth selection of compressed digitized audio data.

19. The portable audio device of claim 18, further comprising a plurality of buttons, including:
a reverse button, wherein the reverse input is selected when the reverse button is depressed;
a forward button, wherein the forward input is selected when the forward button is depressed; and
a play/stop button, wherein the play control input is selected when the play/stop button is depressed.

20. The portable audio device of claim 17, wherein the first time is less than the third time, and the second time is less than the fourth time.

21. The portable audio device of claim 17, wherein the first and second times are less than approximately 1 second and the third and fourth times are greater than approximately 1 second.

22. The portable audio device of claim 15, wherein selecting the play control input for an extended period turns the portable audio device off.

23. The portable audio device of claim 15, wherein the plurality of inputs includes a repeat input and wherein, in response to selection of the repeat input, the portable audio device reproduces at least one selection of the compressed digitized audio data stored in the data storage in a repetitive manner.

24. The portable audio device of claim 19, wherein the at least one processor includes first and second processors.

25. The portable audio device of claim 24, wherein the first processor determines which input signals are being selected and the second processor decompresses the compressed digital sound data.

26. The portable audio device of claim 25, wherein the first processor functions as a CPU and the second processor functions as a DSP.

27. The portable audio device of claim 25, further comprising a transmitter/receiver for receiving compressed digital sound data from a personal computer.

28. The portable audio device of claim 15, further comprising a transmitter/receiver for receiving compressed digital sound data from a data vending machine attached to a telecommunications network.

29. The portable audio device of claim 15, wherein the type provided by the display comprises a type of music.

30. The portable audio device of claim 15, wherein the first selection, the second selection, the third selection, and the fourth selection of compressed digitized audio data include different selections of music.

31. The portable audio device of claim 15, wherein said data storage is non-removable.

32. The portable audio device of claim 15, wherein said data storage is removable.

* * * * *